United States Patent

[11] 3,626,330

[72] Inventor Robert A. Zalonis
South Plainfield, N.J.
[21] Appl. No. 3,147
[22] Filed Jan. 15, 1970
[45] Patented Dec. 7, 1971
[73] Assignee International Telephone and Telegraph Corporation
Nutley, N.J.

[54] CAPACITIVE DIODE CONTROLLED OSCILLATOR FREQUENCY SHIFT KEYING CIRCUIT
1 Claim, 1 Drawing Fig.

[52] U.S. Cl. .......... 331/116 R, 325/163, 331/161, 331/177 V, 331/179, 332/26, 332/30 V, 340/351
[51] Int. Cl. .......... H03b 5/36
[50] Field of Search .......... 331/116 R, 161, 177 V, 179; 332/26, 30 V; 325/163; 340/351

[56] References Cited

UNITED STATES PATENTS

| | | | |
|---|---|---|---|
| 2,531,103 | 11/1950 | Beckwith | 325/163 X |
| 3,118,116 | 1/1964 | Freedman | 331/179 X |
| 3,295,070 | 12/1966 | Tewksbury et al. | 331/179 |
| 3,382,463 | 5/1968 | Hurtig | 331/177 V X |
| 3,408,572 | 10/1968 | Wolf et al. | 331/179 X |

FOREIGN PATENTS

| | | | |
|---|---|---|---|
| 651,369 | 10/1962 | Canada | 331/179 |

*Primary Examiner*—Roy Lake
*Assistant Examiner*—Siegfried H. Grimm
*Attorneys*—C. Cornell Remsen, Jr., Walter J. Baum, Paul W. Hemminger, Percy P. Lantzy, Philip B. Bolton, Isidore Togut and Charles L. Johnson, Jr.

ABSTRACT: A crystal oscillator is shifted between two different discrete frequencies by means of two different voltages being applied to a variable capacitance diode coupled in shunt relation with the crystal. The circuit providing one of the two different voltages having a given value is permanently connected to the diode to provide the lower frequency shift. The other of the two different voltages having a value greater than the given value is provided by a transistor stage under control of a binary signal. The binary signal controls the conduction and nonconduction of the transistor stage to selectively connect and disconnect the other of the two different voltages to the diode. This other higher voltage, and, therefore, the higher frequency shift, is provided only when the transistor stage is nonconductive, which occurs when the condition of the binary signal is low, and overcomes the voltage providing the lower frequency shift.

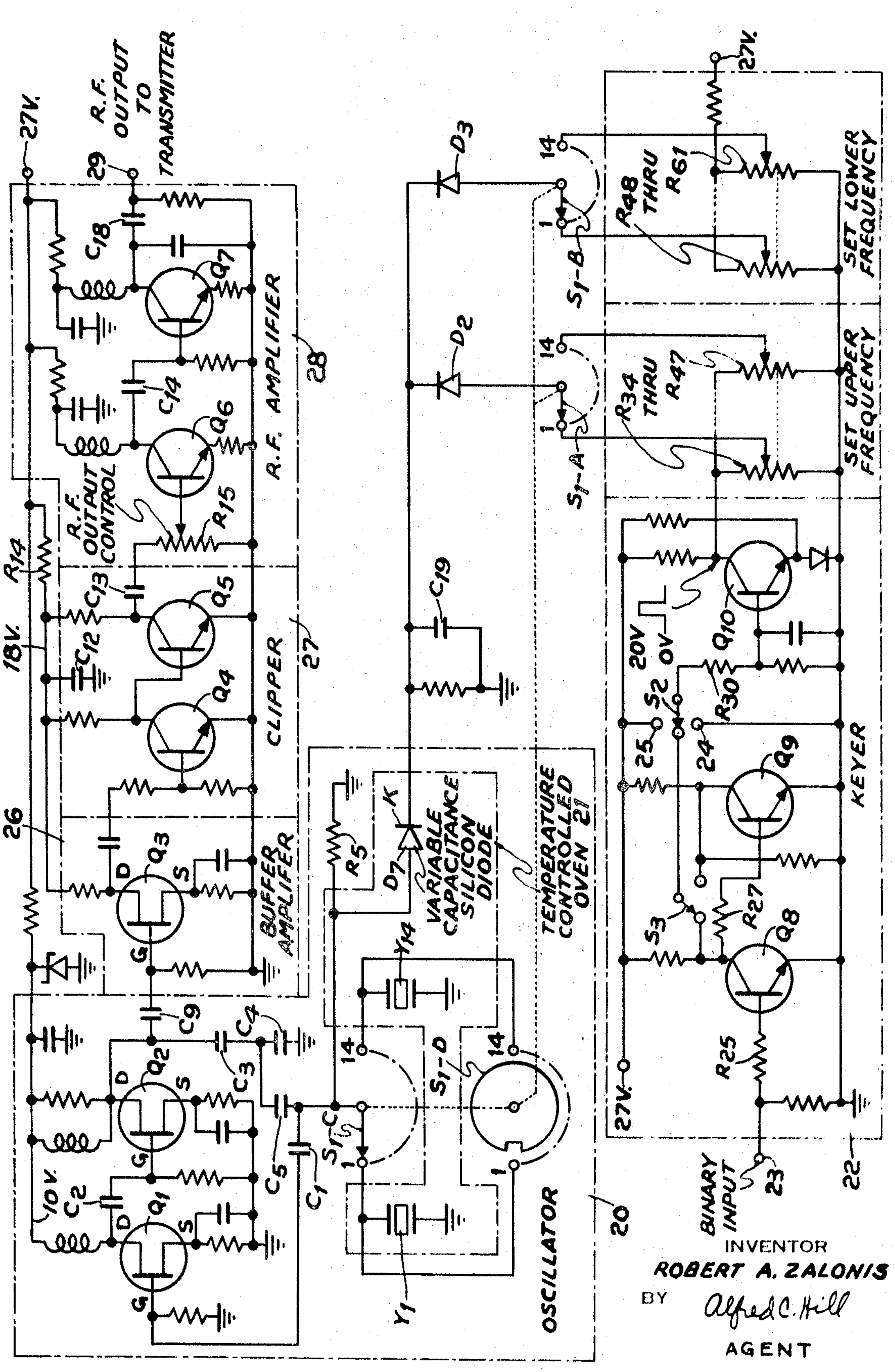
INVENTOR
ROBERT A. ZALONIS
BY Alfred C. Hill
AGENT

CAPACITIVE DIODE CONTROLLED OSCILLATOR FREQUENCY SHIFT KEYING CIRCUIT

BACKGROUND OF THE INVENTION

This invention relates to an arrangement to control the frequency of an oscillator and more particularly to a frequency shift exciter incorporated in a frequency shift keyed (FSK) transmitter.

In the past, frequency shift exciters have generally taken two forms. One form incorporates two oscillators each having a different operating frequency and a circuit arrangement coupled to these oscillators responsive to the binary signal to select one or the other of the oscillators for providing the exciter output signal frequency depending upon the condition of the binary signal.

Another form of frequency shift exciter incorporates a single oscillator whose frequency is controlled to have two different discrete frequencies each of which represents a different one of the conditions of a binary signal. An electromagnetical arrangement, such as a relay, is incorporated to control the connection of two different voltages to the oscillator wherein each voltage will cause the operating frequency of the oscillator to shift between the two discrete frequencies in response to the condition of the binary signal. THe electromechanical arrangement is such that when one voltage is being connected to control the frequency of the oscillator, the circuit providing the other voltage is disconnected physically from the oscillator frequency control point.

SUMMARY OF THE INVENTION

An object of the present invention is to provide still another arrangement for a frequency shift exciter.

Another object of the invention is to provide a circuit to adjust the frequency of an oscillator wherein the circuit providing the voltage to cause production of the lower frequency is permanently connected to the frequency-controlled element of the oscillator and the voltage to provide the upper frequency shift is controlled in response to the binary signal to apply or remove this voltage, and only this voltage, and thereby accomplish the desired frequency shift.

A feature of this invention is the provision of a circuit to shift the operating frequency of an oscillator between a first predetermined frequency and a second predetermined frequency different than the first frequency comprising the oscillator including frequency-determining means and frequency-controlling means coupled to the frequency-determining means; first means permanently connected to the frequency-controlling means to provide a first voltage therefor to shift the operating frequency of the oscillator to the first frequency; and second means selectively coupled to the frequency-controlling means to selectively apply a second voltage thereto to shift the operating frequency of the oscillator to the second frequency.

BRIEF DESCRIPTION OF THE DRAWING

The above-mentioned and other features and objects of this invention will become more apparent by reference to the following description taken in conjunction with the accompanying drawings, in which the sole FIGURE is a schematic diagram illustrating the frequency shift exciter in accordance with the principles of the present invention.

DESCRIPTION OF THE PREFERRED EMBODIMENT

Referring to the FIGURE, the frequency shift exciter includes an oscillator 20 including two field effect transistors Q1 and Q2 and one of the crystals Y1–Y14 as selected by switch S1–C depending upon the output frequency desire. Variable capacitance silicon diode D7 is connected in shunt relation to the selected crystal. The frequency shift of the operating frequency of oscillator 20 is accomplished by applying two discrete DC (direct current) voltages to the cathode of diode D7. The crystals Y1–Y14 and diode D7 are contained in temperature-controlled oven 21 which is regulated at a given temperature to overcome variations in the operating conditions of the oscillator as caused by temperature variations. As briefly mentioned switch S1–C selects one of 14 crystals for operation with the oscillator circuit comprising the two field effect transistors Q1 and Q2. Switch S1–D short circuits the terminals of the unselected crystals.

The RF (radio frequency) voltage developed across the selected crystal is loosely coupled through capacitor C1 to the gate terminal G of transistor Q1. This RF voltage is amplified and is reversed in polarity at the drain D of transistor Q1 and is coupled to the gate G of transistor Q2 by capacitor C2. The amplified voltage at the drain D of transistor Q2 is in phase with the voltage applied to gate G of transistor Q1. Capacitors C3 and C4 are connected as an RF voltage divider across the output of transistor Q2 as illustrated. The low voltage drop across capacitor C4 is fed back to the selected crystal through capacitor C5 to sustain oscillation.

While the frequency of oscillation is determined primarily by the selected crystal, this frequency is varied or shifted by controlling the shunt capacitance of the selected crystals. The control of the shunt capacitance of the selected crystal is accomplished by diode D7 in shunt relation with the selected crystal which functions as a variable capacitor when positive voltages of 0.1 to 20 volts are applied to its cathode K (reverse direction).

The frequency shift of oscillator 20 is accomplished by applying two discrete DC voltage levels to the cathode of diode D7 which are controlled by output transistor Q10 of keyer 22. Increasing the voltage applied to the cathode of diode D7 lowers its capacitance and thereby increases the oscillator frequency.

The anode of diode D7 is connected to the selected crystal through switch S1–C. The cathode of diode D7 is RF bypassed to ground through capacitor C19. Resistor R5 is a DC ground return for the anode of diode D7. Two discrete DC voltages are applied to the cathode of diode D7 by a pair of potentiometers which serve as the upper and lower frequency trimmer adjustments.

The lower frequency adjustment potentiometers R48–R61 are connected in parallel to an operating voltage source having a given value, for instance, 20 volts DC. The DC voltage drop at the adjustable arm or terminal of the potentiometer selected by switch S1–B is connected to the cathode of diode D7 through the forward direction of diode D3. Diode D3 and the selected one of potentiometers R48 through R61 are permanently connected to diode D7. The upper frequency adjustment poteniometers R34–47 are connected in parallel to the collector of transistor Q10. The voltage drop at the adjustable arm or terminal of the potentiometer selected by switch S1–A is connected to the cathode of diode D7 through the forward direction of diode D2. The higher voltage of the potentiometers R34 through R47 or R48 through R61 predominates at diode D7. The reverse directions of diodes D2 and D3 minimizes any loading effect (interaction) on the setting of the upper and lower potentiometers. poteniometers. Switches S1–A through S1–D are mechanically linked as illustrated.

After the lower frequency potentiometer is adjusted, the voltage drop at its adjustable arm remains constant. The arm of the potentiometers R34 through R47 to set the higher frequency is adjusted to a higher voltage than the voltage provided by potentiometers R48 to R61 while a 20 volts DC is present at the collector of output transistor Q10. At this time oscillator 20 produces the upper frequency shift signal. When a positive voltage is applied to the base of transistor Q10 its collector voltage drops to nearly zero thereby removing the upper frequency potentiometer voltage from diode D7. The voltage drop provided by the lower frequency potentiometer then controls oscillator 20 to produce the lower frequency shift signal.

When the voltage provided by the upper frequency potentiometer, which is higher than the voltage provided by the lower frequency potentiometer, is coupled through diode D2, diode D3 is effectively back biased so that the voltage provided by the lower frequency potentiometer has no effect on diode D7.

Thus, the frequency shift of oscillator 20 is effected through output transistor Q10 by applying or removing the upper frequency DC voltage from the cathode of diode D7.

Keyer 22 includes transistor stages Q8, Q9 and Q10 for the purpose of controlling the voltage applied to the frequency shift or controlling element (diode D7) of the oscillator in cadence with the on-off binary pulse input applied to terminal 23. This binary input may be from Telex, binary data or DC pulse equipment which will be converted by the exciter of this invention into narrow band RF shift keyed pulses.

The base of transistor Q8 is connected to input terminal 23 through current-limiting resistor R25. Q8 will conduct and saturate for positive input voltages of 2 to 30 volts DC. During this time, the collector of transistor Q8 is at nearly zero potential. With switch S3 in the upper frequency position (the position illustrated) the base of transistor Q10 is connected to the collector of transistor Q8 through the normal illustrated position of switch S2 and resistor R30. Under these conditions, output transistor Q10 is cut off and its collector applies 20 volts DC to the upper frequency adjustment potentiometers R34–R47 placing oscillator 20 in the upper frequency shift.

When the input voltage at terminal 23 drops to zero volts, transistor Q8 stops conducting, its collector voltage rises to 14 volts causing transistor Q10 to conduct. The collector voltage of transistor Q10 drops to zero removing control voltage from the upper frequency potentiometers thereby enabling the voltage provided by lower frequency potentiometers R48–R61 to shift oscillator 20 to the lower frequency shift condition.

Thus, with switch S2 and S3 placed in the illustrated positions, oscillator 20 will shift to the upper frequency when a "-mark" signal is applied to terminal 23. When the input to terminal 23 is zero volts ("space" signal) transistor 10 will conduct and oscillator 20 will shift to the lower frequency shift condition.

Transistor Q9 reverses the above relationship of upper/lower frequency shift with respect to "mark"/"space" inputs by reversing the output pulses of transistor Q8 before they are applied to the base of transistor Q10. The base of transistor Q9 is directly coupled to the collector of transistor Q8 through resistor R27. With switch S3 set to its other position, the inverted pulses at the collector of transistor Q9 are applied to the base of transistor Q10.

Switch S2 is a three-pole momentary switch used to facilitate the adjustment of the upper and lower frequency setting potentiometers independent of the "mark" and "-space" conditions of transistor Q8 or Q9 and the setting of switch S3. When switch S2 is connected to ground through contact 24, the base of transistor Q10 is at ground potential and the upper frequency shifting potentiometers are adjusted to provide the desired upper frequency shift. When switch S2 is held against contact 25, the base of transistor Q10 is connected to 27 volts DC through resistor R30 and the lower frequency potentiometers are then adjusted for the desired lower frequency shift condition.

The frequency-shifted signal of oscillator 20 is coupled from the drain D of transistor Q2 to the gate G of field effect transistor Q3 of buffer amplifier 26 through coupling capacitor C9. The signal is amplified at drain D of transistor Q3 and coupled to the base of transistor Q4 contained in clipper 27. Because the amplitude of the output signal of oscillator 20 varies with large frequency shifts and also from crystal to crystal, transistor Q4 and Q5 contained in clipper 27 limit the positive and negative peaks of the output signal of oscillator 20 to provide a constant amplitude voltage for application of transistor Q6 included in the output RF amplifier 28.

The operating voltage for buffer amplifier 26 and clipper 27 is lowered to 18 volts by resistor R14 and by passed by capacitor C12.

The limited signal at the collector of transistor Q5 is coupled to the base of transistor Q6 through coupling capacitor C13 and potentiometer R15 which functions as an RF output control to adjust the amplitude of the voltage coupled from terminal 29 to drive the succeeding transmitter circuitry (not illustrated).

The amplitude signal at the collector of transistor Q6 is coupled to the base of transistor Q7 through capacitor C14. The collector of transistor Q7 is coupled to the RF output terminal 29 by capacitor C18.

With potentiometer R15 set for maximum output, the output voltage at terminal 29 will be approximately 12 volts RMS (root means square) at 3 megahertz into a 75-ohm load.

In the foregoing description various values have been given for operating voltages, output voltages and the bias voltages provided by the upper and lower frequency setting potentiometers. It is to be noted, however, that these values are only for the purposes of explanation and may be modified to suit many different specifications which the exciter disclosed herein is capable of satisfying.

While I have described above the principles of my invention in connection with specific apparatus, it is to be clearly understood that this description is made only by way of example and not as a limitation to the scope of my invention as set forth in the objects thereof and in the accompanying claims.

I claim:

1. A circuit to shift the operating frequency of an oscillator between a first predetermined frequency and a second predetermined frequency different than said first frequency comprising:
   - said oscillator including
     - frequency-determining means, and
     - frequency-controlling means coupled to said frequency-determining means;
   - first means permanently connected to said frequency-controlling means to provide a first voltage therefore to shift the operating frequency of said oscillator to said first frequency; and
   - second means selectively coupled to said frequency-controlling means to selectively apply a second voltage thereto to shift the operating frequency of said oscillator to said second frequency;
   - said frequency-determining means including
     - at least one crystal;
   - said frequency-controlling means including
     - a variable capacitance diode coupled in shunt relation with said crystal;
   - said first means including
     - ground potential,
     - an operating voltage source,
     - a first potentiometer having an adjustable terminal and two fixed terminals, said fixed terminals being coupled in series with said operating voltage source and said ground potential, and
     - a first diode coupled between said adjustable terminal and said variable capacitance diode to provide said first voltage for said variable capacitance diode; and
   - said second means including
     - a control voltage source, said control voltage having a first amplitude and a second amplitude,
     - a transistor having its base coupled to said control voltage source, its emitter coupled to said ground potential and its collector coupled to said operating voltage source,
     - a second potentiometer having an adjustable terminal and two fixed terminals, said fixed terminals being coupled between the collector of said transistor and said ground potential, and
     - a second diode coupled between said adjustable terminal of said second potentiometer and said variable capacitance diode to provide said second voltage for said variable capacitance diode only when said control voltage has said first amplitude.

* * * * *